(12) United States Patent
Hendrickson et al.

(10) Patent No.: US 7,326,353 B2
(45) Date of Patent: Feb. 5, 2008

(54) METHODS FOR RECLAIMING DEVELOPING SOLVENTS

(75) Inventors: Constance Marie Hendrickson, Irving, TX (US); David Calvin Bradford, Winston Salem, NC (US)

(73) Assignee: Nupro Technologies, Winsto-Salem, NC (US)

( * ) Notice: Subject to any disclaimer, the term of this patent is extended or adjusted under 35 U.S.C. 154(b) by 0 days.

(21) Appl. No.: 11/341,654

(22) Filed: Jan. 30, 2006

(65) Prior Publication Data

US 2006/0217450 A1    Sep. 28, 2006

Related U.S. Application Data

(60) Continuation-in-part of application No. 10/937,386, filed on Sep. 10, 2004, which is a continuation-in-part of application No. PCT/US2004/227560, filed on Jul. 15, 2004, which is a continuation-in-part of application No. 10/437,305, filed on May 14, 2003, now abandoned, which is a division of application No. 09/993,912, filed on Nov. 27, 2001, now Pat. No. 6,582,886.

(51) Int. Cl.
*B04B 1/00* (2006.01)
*G03F 7/32* (2006.01)

(52) U.S. Cl. ............ 210/749; 210/787; 210/806; 422/24; 430/398; 430/399

(58) Field of Classification Search ........... 210/749, 210/787, 806, 198.1, 304, 360.1, 380.1; 430/398, 430/399; 422/24
See application file for complete search history.

(56) References Cited

U.S. PATENT DOCUMENTS

| | | | |
|---|---|---|---|
| 3,090,774 A * | 5/1963 | Scoggin | 528/499 |
| 4,177,074 A | 12/1979 | Proskow | |
| 4,323,636 A | 4/1982 | Chen | |
| 4,323,637 A | 4/1982 | Chen et al. | |
| 4,369,246 A | 1/1983 | Chen et al. | |
| 4,423,135 A | 12/1983 | Chen et al. | |
| 4,517,279 A | 5/1985 | Worns | |
| 4,806,452 A | 2/1989 | Hoffmann et al. | |
| 4,847,182 A * | 7/1989 | Worns et al. | 430/309 |
| 5,240,815 A | 8/1993 | Telser et al. | |
| 6,248,502 B1 * | 6/2001 | Eklund | 430/331 |
| 2003/0211429 A1 * | 11/2003 | Fiebag et al. | 430/398 |
| 2006/0054560 A1 * | 3/2006 | Hendrickson et al. | 210/659 |

FOREIGN PATENT DOCUMENTS

GB      1358062      6/1974

* cited by examiner

*Primary Examiner*—David A Reifsnyder
(74) *Attorney, Agent, or Firm*—Blank Rome LLP

(57) ABSTRACT

The present invention relates to an improved method for reclaiming and recycling developing solvents used in the production of flexographic printing plates. More specifically, the invention relates to reclaiming and/or recycling of the developing solvent through centrifugation and/or filtration. According to the invention, the solvent used in developing printing plates can be reclaimed and/or recycled by simply centrifuging the polymer-contaminated solvent. In certain embodiment, the centrifuged solvent is further filtered. The process involves transferring the contaminated solvent, from a plate processor or a dirty holding tank, to a centrifuge, and centrifuging the contaminated solvent to remove the polymer. The reclaimed solvent can be transfer directly back to the plate processor or to a clean holding tank.

19 Claims, 5 Drawing Sheets

"DESLUDGER" SOLID BOWL DISC CENTRIFUGE

METHODS FOR RECLAIMING DEVELOPING SOLVENTS

This application is a continuation-in-part (CIP) of U.S. patent application Ser. No. 10/937,386, filed Sep. 10, 2004 still pending; and of PCT/US2004/022756 (published as WO 2005/013010), filed Jul. 15, 2004, which claims the priority of U.S. patent application Ser. No. 10/627,712, filed Jul. 28, 2003 abandoned, which is a CIP of U.S. patent application Ser. No. 10/437,305, filed May 14, 2003 abandoned, which is a divisional of U.S. patent application Ser. No. 09/993,912, filed Nov. 27, 2001, now U.S. Pat. No. 6,582,886; all of which are incorporated herein by reference.

FIELD OF THE INVENTION

The present invention relates to an improved method for reclaiming and recycling developing solvents used in the production of flexographic printing plates. More specifically, the invention relates to reclaiming and/or recycling of the developing solvent through centrifugation and/or filtration.

BACKGROUND OF THE INVENTION

Washout processes for the development of photopolymerizable flexographic printing plates are well known and are described in detail in U.S. Pat. No. 5,240,815, which is incorporated herein by reference. Ordinarily, exposed plates are washed (developed) in a developing solvent that can remove the unpolymerized material while leaving the polymerized (cured) material intact. The solvent typically used in such processes include: (a) chlorohydrocarbons, such as trichloroethylene, perchloroethylene or trichloroethane, alone or in a mixture with a lower alcohol, such as n-butanol; (b) saturated cyclic or acyclic hydrocarbons, such as petroleum ether, hexane, heptane, octane, cyclohexane or methylcyclohexane; (c) aromatic hydrocarbons, such as benzene, toluene or xylene; (d) lower aliphatic ketones, such as acetone, methyl ethyl ketone or methyl isobutyl ketone; and (e) terpene hydrocarbons, such as d-limonene.

One important disadvantage of the known solvents and the procedures for their use is that the solvents being used as developers may act too slowly, causing swelling of the plates and/or damage to the fine detail in the plate by undercutting and/or pinholing. Moreover, when non-chlorinated solvents are used in the washout process, long drying times may be necessary. Furthermore, many of these solvents have flashpoints of less than 100° F., so that the process can only be operated in special, explosion-protected plants. Many of the prior art solvents are considered Hazardous Air Pollutants (HAPS), and are subject to stringent reporting requirements. When chlorohydrocarbons and other toxic chemicals are used, their toxicity also gives rise to disposal problems and worker safety issues.

An essential step to any photopolymerizable relief printing process is the development of the printing plate after the image is formed through imagewise exposure of the photopolymerizable plate to light. The image is formed by polymerizing and crosslinking of the photopolymerizable material that is exposed while the unexposed portion remains unpolymerized. Ordinarily, development is accomplished by washing the exposed plate in a solvent which can remove the unpolymerized and/or uncrosslinked material while leaving the polymerized (cured) material intact. Because such plates can be formed from a variety of materials, it is necessary to match a specific plate with an appropriate solvent. For example, U.S. Pat. Nos. 4,323,636, 4,323,637, 4,423,135, and 4,369,246, the disclosures of which are incorporated herein by reference, disclose a variety of photopolymer printing plate compositions based on block copolymers of styrene and butadiene (SBS) or isoprene (SIS). These compositions can be utilized to produce printing plates which can be developed by a number of aliphatic and aromatic solvents, including methyl ethyl ketone, toluene, xylene, d-limonene, carbon tetrachloride, trichloroethane, methyl chloroform, and tetrachloroethylene. These solvents may be used alone or in a mixture with a "non-solvent" (i.e. a substance that cannot dissolve unpolymerized materials), for example, trichloroethane with ethanol. In any case, during the development step, the solvent can be applied in any convenient manner such as by pouring, immersing, spraying, or roller application. Brushing, which aids in the removal of the unpolymerized or uncrosslinked portions of the composition, can also be performed to facilitate the processing of the plate.

Similarly, UK 1,358,062 discloses photosensitive compositions consisting of a nitrile rubber with an addition of photopolymerizable tri- or tetra-unsaturated ester derived from acrylic or methacrylic acid combined with an addition polymerization initiator activated by actinic radiation. Plates made from this composition can be developed by organic solvents including aliphatic esters such as ethyl acetate, aliphatic ketones such as acetone, methyl ethyl ketone, d-limonene, halogenated organic solvents, such as chloroform, methylene chloride, CFC 113 or blends of such solvents. Brushing or agitation can be used to facilitate the removal of the non-polymerized portion of the composition.

U.S. Pat. No. 4,177,074 discloses a photosensitive composition containing a high molecular weight butadiene/acrylonitrile copolymer which contains carboxyl groups, a low molecular weight butadiene polymer which may or may not contain carboxyl groups, and an ethylenically unsaturated monomer, combined with a free-radical generating system. This composition is also used as the polymer layer of a flexographic printing plate and requires processing with such organic solvents as methyl ethyl ketone, benzene, toluene, xylene, d-limonene, trichloroethane, trichlorethylene, methyl chloroform, tetrachloroethylene, or solvent/non-solvent mixtures, e.g., tetrachloroethylene and n-butanol. The composition may also be processed with water-soluble organic solvents in an aqueous basic solution, such as sodium hydroxide/isopropyl alcohol/water; sodium carbonate/isopropyl alcohol/water; sodium carbonate/2-butoxyethanol/water; sodium borate/2-butoxyethanol/water; sodium silicate/2-butoxyethanol/water; sodium borate/2-butoxyethanol/water; sodium silicate/2-butoxyethanol/glycerol/water; and sodium carbonate/2-(2-butoxyethoxy)ethanol/water.

U.S. Pat. No. 4,517,279, the disclosure of which is incorporated herein by reference, discloses a photosensitive composition containing a high molecular weight butadiene acrylonitrile copolymer which contains carboxyl groups, and a high molecular weight butadiene/acrylonitrile copolymer which does not contain carboxyl groups, combined with ethylenically unsaturated monomer and a free radical generating system. That composition, which is also used as the polymer layer of a flexographic printing plate, requires processing by blends of tetrachloroethylene and a non-solvent. The composition may also be processed in mixtures of sodium hydroxide/isopropyl alcohol/water; sodium carbonate/2-butoxyethanol/water; sodium silicate/2-butoxyethanol/water; sodium carbonate/2-butoxyethanol/glycerol/water; and sodium hydroxide/2-(2-butoxyethoxy)ethanol/water.

As can be seen from the foregoing examples of the prior art, the solvents needed for image development will vary depending on the composition of the polymer layer of the plate. The need for different solvent systems is particularly inconvenient, especially if different photopolymer systems are being processed at the same facility. Furthermore, many of the solvents used to develop the plates are toxic or suspected carcinogens. Thus, there exists a need for solvent systems which can be used with a greater degree of safety. In addition, there exists a need for solvent systems which can be used in a variety of plates. U.S. Pat. Nos. 4,806,452 and 4,847,182, the disclosures of which are incorporated herein by reference, disclose solvent developers for flexographic plates containing terpene hydrocarbons such as d-limonene which are effective on a variety of plate types. These terpene hydrocarbon-based developers are also non-toxic. However, they have proven to be hazards in the workplace because of their tendency to spontaneously combust, thereby, causing fires.

Therefore, commonly assigned U.S. Pat. No. 6,248,502 solves the drawbacks of terpene by using terpene esters as a substitute developing solvent. Because terpene ester has a higher flash point, the fire risk is greatly decreased. However, terpene esters tends to breakdown through repeated distillation which limits the recyclability of the solvent.

A major drawback of the prior art developing solvent is the lack of an inexpensive method to reclaim the solvent for subsequent use. Reclamation and recycling of current solvents generally require distillation which is energy and labor intensive.

SUMMARY OF THE INVENTION

The present invention relates to environmentally friendly, simple, and inexpensive methods for reclaiming and/or recycling developing solvents used in the production of flexographic printing plates, which offer significant improvement over the prior art. Generally, when flexographic printing plates are developed in solvents, the solvents used become contaminated with the unpolymerized and/or uncrosslinked residues (polymer-contaminated solvent). To reclaim and/or recycle the solvent for reuse, the polymer contamination must be removed from the solvent. To that end, Applicant has discovered that the solvent can be reclaimed and/or recycled by simply centrifuging the polymer-contaminated solvent. In certain embodiment, the centrifuged solvent is further filtered The reclaiming process can be continuous or batch. The process comprises transferring the contaminated solvent, from a plate processor or a dirty holding tank, to a centrifuge, and centrifuging the contaminated solvent to remove the polymer. The reclaimed solvent can be transfer directly back to the plate processor or to a clean holding tank.

DETAILED DESCRIPTION OF THE INVENTION

After utilization as a developing solvent, the solvent is contaminated with polymers released from the printing plate. Because the solvent is relatively expensive, it is desirous to be able to recycle the solvent for subsequent developing processes. Applicant has discovered that the present substituted benzene-based solvent can be separated from the polymer contaminate simply through centrifugation, and preferably followed by filtration. The reclaimed solvent has a purity of greater than about 95%, preferably 99.5%.

Figure 1:
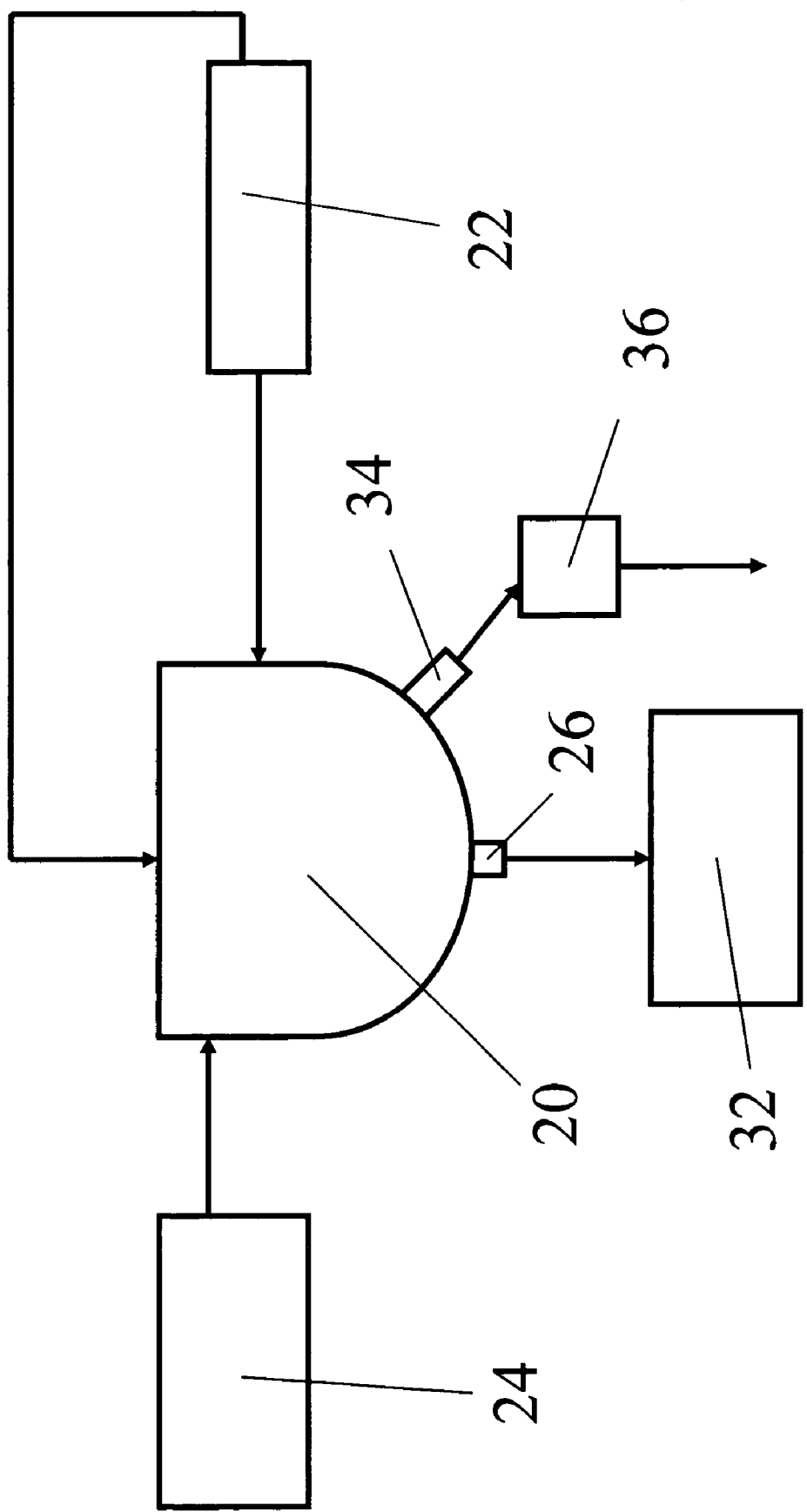
FIG. 1 shows an embodiment of the invention where the reclaimed solvent is associated with a single plate processor.
Figure 2:
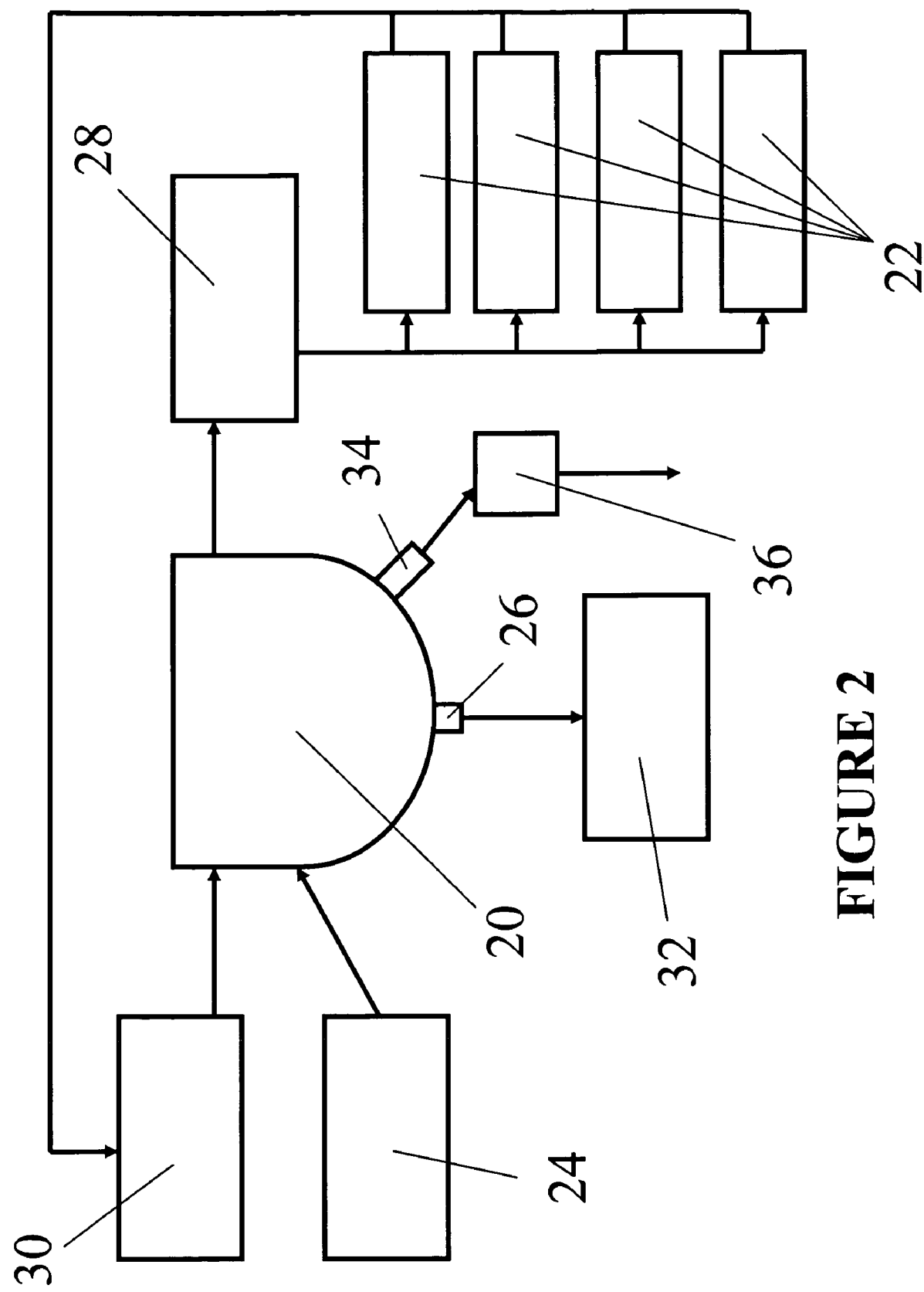
FIG. 2 shows an embodiment where the reclaimed solvent is associated with multiple plate processors.

The reclamation and/or recycling process is described in FIGS. 1 and 2. FIG. 1 discloses the reclamation process with a single plate processor set up. The polymer-contaminated solvent from the plate processor 22 is fed into the centrifuge 20, preferably through a conduit. Typically, the polymer-contaminated solvent contains about 3% to about 10% polymer, most preferably about 6% polymer. Because the process yield is generally less than 100%, fresh solvent is also fed into the centrifuge from a replenishment drum 24.

Figure 5:
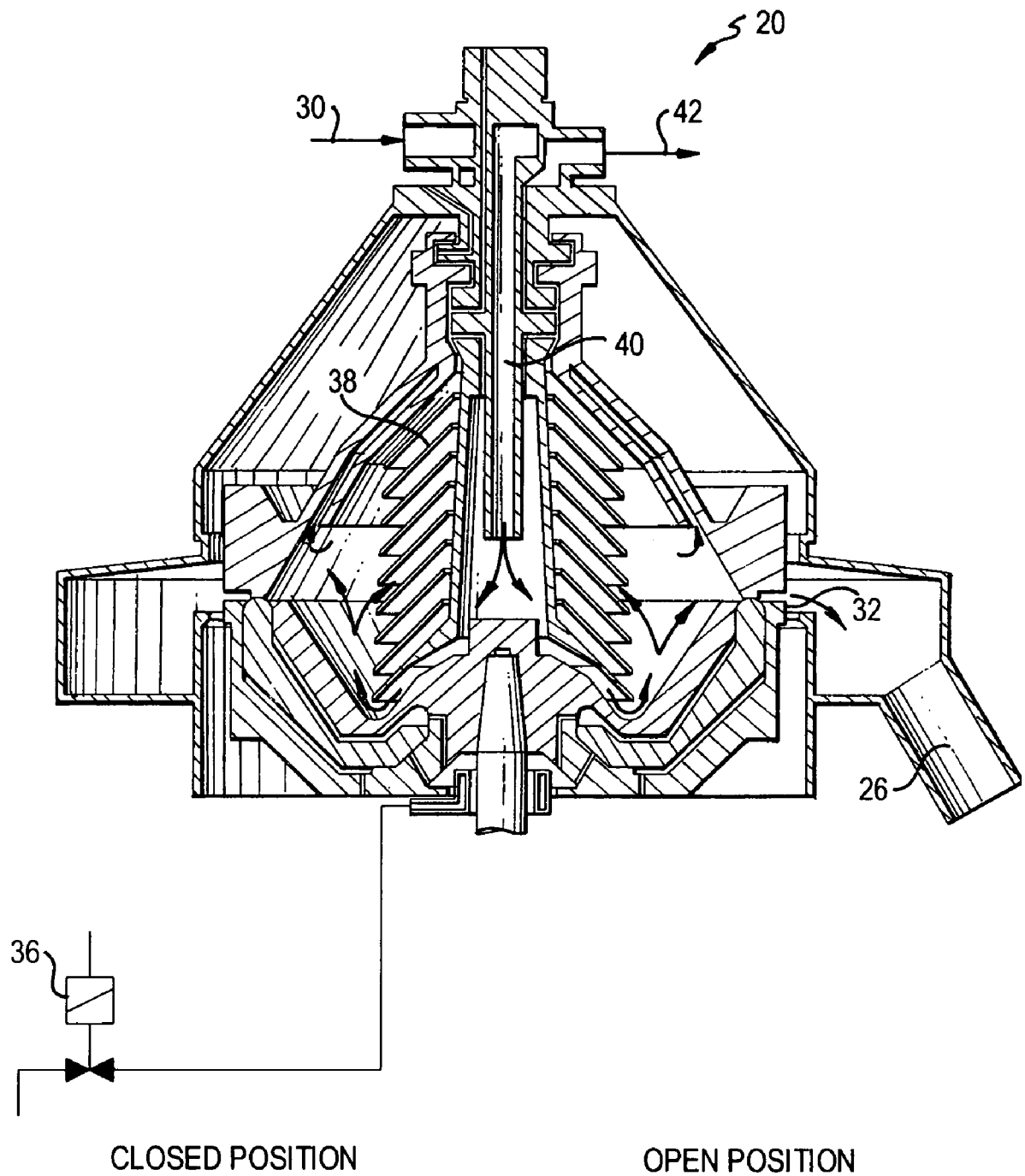
FIG. 5 shows a bowl disc centrifuge.

The centrifuged 20 used is preferably, but not limited to, a bowl disc centrifuge shown in FIG. 5. Polymer-contaminated solvent to be purified is fed to the feed port 30 of the centrifuge, from which it flows down the central feed tube 40 and out into the bowl 44 at the bottom of the disc stack 38. While contaminated solvent is fed to the centrifuge at the feed port 30, the moveable piston 32 is in the up or closed position, as controlled by the flow of the centrifuge operating fluid (usually water), which is delivered to the centrifuge by the action of a solenoid valve 36. The solvent flows through the discs 38, which retain polymers more dense than the solvent. The polymer travels to the periphery of the discs and are accelerated to the outermost part of the bowl, where they are collected. The purified solvent transits the disc stack 38 to the outer periphery of the bowl 44 and exits the centrifuge as the clarified product at the exit 42. Periodically, solids are ejected from the centrifuge bowl by briefly opening the moveable piston 32 by means of the operating fluid. The polymer waste stream is ejected from the bowl through the waste port 26. Typically, the centrifuge bowl is open for about 3 second at a time for ejecting the polymer waste from the bowl. During each opening, about 0.017 pounds of solvent is lost per square foot of photopolymer plate processed. The waste is held in a waste holding tank to be prepared for disposal. For safety purposes, the centrifuge may have a pressure relief valve attached to an exhaust fan for venting if excessive pressure is present in the system.

The purified solvent can be fed directly to the plate processor 22 as depicted in FIG. 1 or to a clean holding tank 28 to be prepared for subsequent use as shown in FIG. 2. In an embodiment of the invention, the polymer-contaminated solvent is transferred from the plate processors to a dirty holding tank 30 before being fed into the centrifuge 20. Likewise, the purified solvent exiting the centrifuge 20 is transferred to a clean tank before the solvent is distributed to individual plate processor. The process of FIG. 2 is more flexible than that of FIG. 1 because the number of operating plate processor can be varied according to the needs and requirements of the overall developing process.

Figure 3:
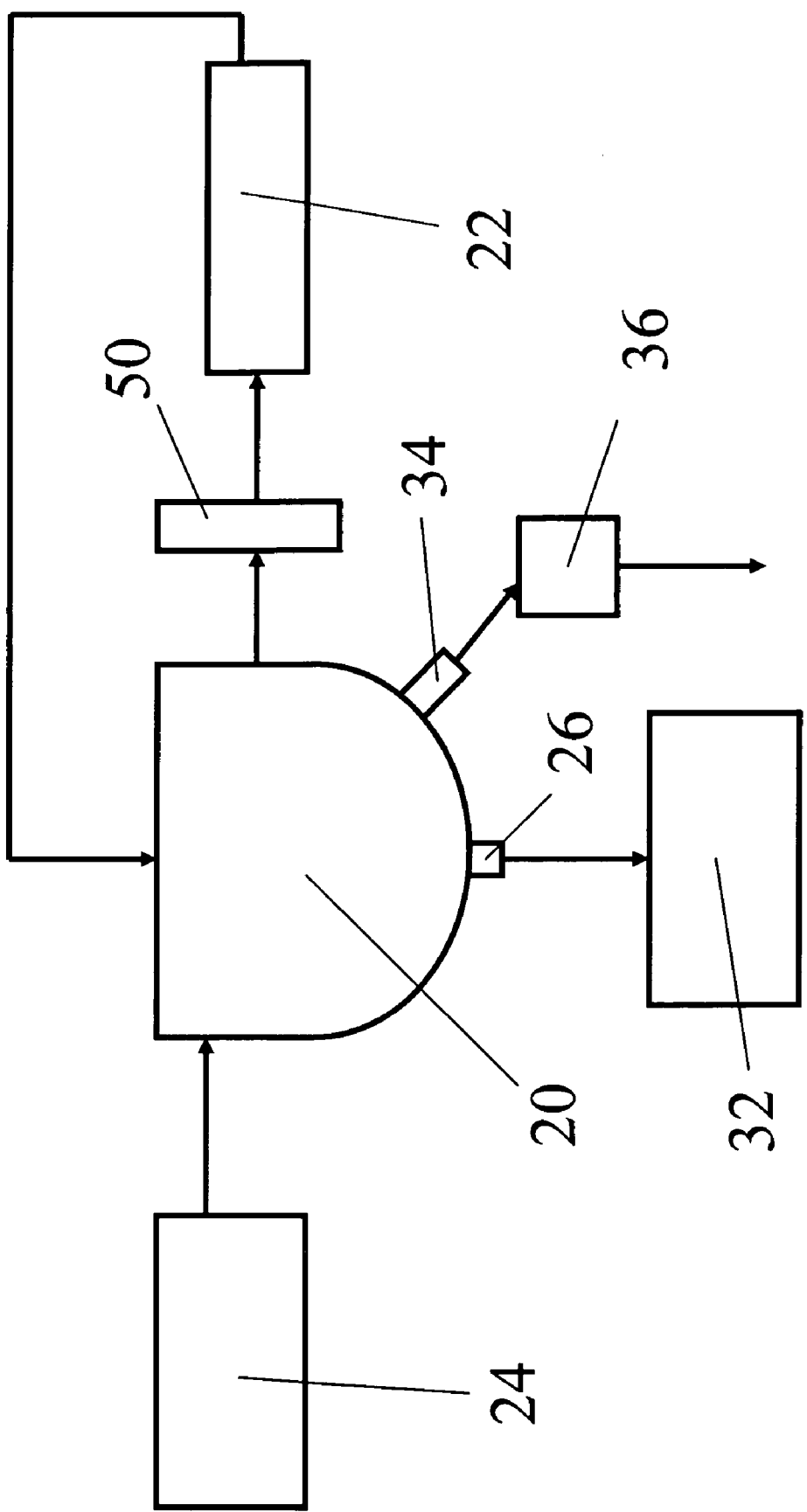
FIG. 3 shows the embodiment of FIG. 1 where a filter has been added after the centrifugation.
Figure 4:
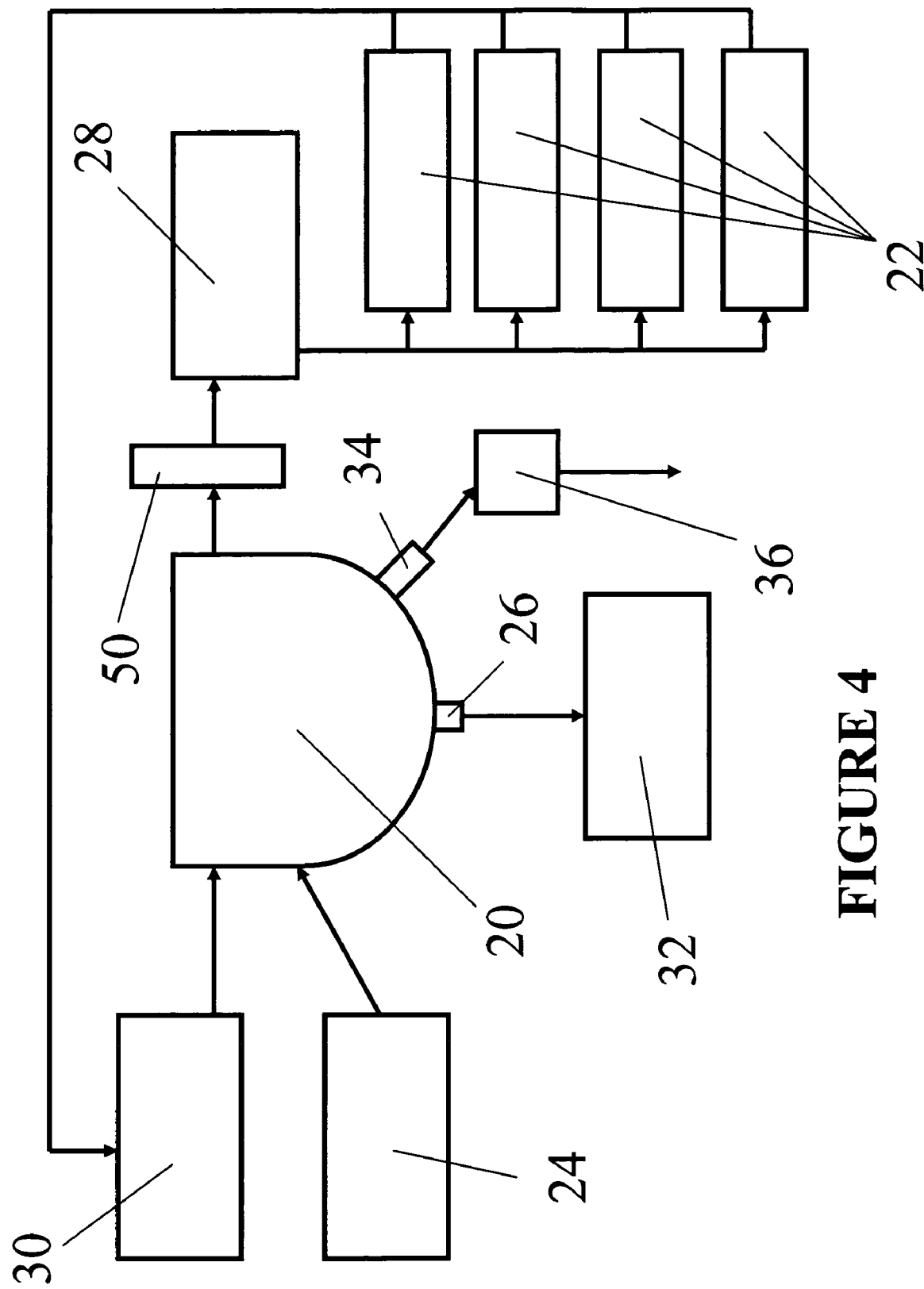
FIG. 4 shows the embodiment of FIG. 2 where a filter has been added after the centrifugation.

In a preferred embodiment, as depicted in FIGS. 3 and 4, of the present invention, the purified solvent is directed through a filter 50 downstream of the centrifuge and prior to being fed into the plate processor 22 or the clean holding tank 28. The filter serves to remove particulate materials in the purified solvent and further clarifying and/or purifying the solvent.

Although FIGS. 3 and 4 depict the filter downstream of the centrifuge, the filter can also be located upstream of the centrifuge, alone or in addition to a downstream filter, most preferably between the dirty holding tank 30 and the centrifuge or between the plate processor 22 and the dirty holding tank 30 (not shown in the drawings). The filter serves to remove particulate materials in the solvent prior to being fed into the centrifuge.

Preferably the filter can be a polypropylene bag or a cartridge typed filter, preferably polypropylene. The filter pore size is preferably between 1 to about 10 microns. In certain embodiments, a series of filters provides the most efficient operation. In those cases, a gradual step down in pore size from about 10 microns to about 1 micron is preferred.

Most preferably, the filter is a membrane filter, preferably polypropylene or polytetrafluoroethylene (PTFE), utilizing tangential or crossflow configurations. To reduce fouling, shear is induced at the surface of the membrane through vibration, preferably torsional vibration. The vibration produces shear waves that propagate sinusoidally from the surface to the membrane to increase shear at the membrane surface, which results in the elimination of the stagnant boundary layer at the membrane surface that causes fouling in traditional membrane filters. The vibration preferably generates a shear rate on the surface of the membrane of about 100,000-200,000 sec.$^{-1}$, more preferably about 125,000-175,000 sec.$^{-1}$, and most preferably about 150,000 sec.$^{-1}$. Most preferably, the filter resides of a disk plate that that vibrates torsionally about its center at a frequency of about 40-65 Hz, preferably about 45-60 Hz, and most preferably about 50-55 Hz.

The centrifuge may be any type of centrifuge, preferably a disc centrifuge provided with conical discs and able to centrifuge liquids at high g forces as described above. Depending on the characteristics and throughput of the solvent being processed and the size of the centrifuge bowl, the desludger centrifuge rotational speed should be adjusted so as to provide a centrifugal force of at least about 4,000 g, and preferably between about 4,000 g and 12,000 g. Since the g force is a function of the rotational speed and the radius of the centrifuge bowl, the optimum process g force is limited only by the size of the equipment used and the strength of the stainless steel or other alloy used in the fabrication of the equipment.

During the purification process, various enhancements to aid in the centrifugal or filtration removal of waste unpolymerized material may be used and aligned in combination with one another. For example, the washout solvent may be treated with ultraviolet light of a wavelength appropriate to the polymer plate used, preferably in the range of 200-400 nanometers, in order to cross link the washed out, unpolymerized material.

In addition, a precipitant or co-polymerizing material may be added to the solvent undergoing purification to enhance centrifugation or filtration. The precipitant or co-polymerizing material can be, but is not limited to, chitin, fibrous cellulose, perlite, various inorganic compounds such as $MgSO_4$, $AlCl_3$, and $FeCl_3$, saw dust, vermiculite, organic polymers such as polyvinyl alcohol or acetate, and combinations thereof.

The solvent is preferably maintained at room temperature throughout the process. Most preferably, the solvent is maintained at about 70° F. This can be accomplished through cooling and/or heating of the solvent in the piping system, the centrifuge, the filter, and/or elsewhere in the process. On the other hand, depending on the particular solvent composition, no heating and/or cooling is required as room temperature is sufficient to maintain the solvent temperature in the operating range.

The solvent suitable for the present reclaiming and/or recycling process can include, but is not limited to, terpene esters, terpene ethers, alkyl esters, substituted benzenes, and combinations thereof. The terpene ester can be, but is not limited to, terpinyl acetate, terpinyl formate, isobornyl acetate, isobornyl formate, fenchyl acetate, linalyl acetate, citronellyl acetate, geranyl acetate, or combinations thereof.

The terpene ether can be, but is not limited to, but not limited to, terpenyl alkyl ether, fenchyl alkyl ether, limonyl alkyl ether, and geranyl alkyl ether, with one alkyl group from 1-18 carbons.

The alkyl esters have the general formula RCOOR', where R can be any organic moiety, and R' is an alkyl group, preferably having 1 to 12 carbon atoms. R' can also be a linear or branched alkyl group. Thus, the preferred alkyl esters for this invention includes, but are not limited to, methyl esters, ethyl esters, propyl esters, butyl esters, pentyl esters, hexyl esters, octyl esters, nonyl esters, decyl esters, undecyl esters, dodecyl esters, and any branched compound thereof including isopropyl esters, isobutyl esters, etc. A wide variety of alkyl esters are suitable for use in the solvents of this invention including, but are not limited to, alkyl esters of fatty acids with 8-18 carbons.

The substituted benzene preferably has the general formula I

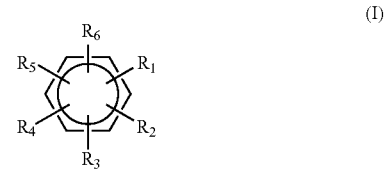

where $R_1$ to $R_6$ are the same or different and denote hydrogen, hydroxyl, alkyl, alkenyl, aryl, amine/amide, ester, carboxylic acid, and aldehyde, preferably $R_1$ is a tert-butyl. Most preferably, the substituted benzenes are diisopropyl benzene; butyl benzenes, such as tert-butyl benzene, tert-butyl xylene, di-tert-butyl benzene, tert-butyl toluene, di-tert-butyl toluene, di-tert-butyl xylene, and 1-tert-butyl-3,5-dimethylbenzene; di-butyl benzenes, such as di-sec-butyl benzene, di-n-butyl benzene, wherein the substitution can be in the ortho, para, or meta positions; and combinations thereof.

The solvent, which can be used either alone or in a blended form with co-solvents and/or non-solvents, can be used to develop a number of different photopolymer printing plates. As used herein, co-solvents are other compounds that can also dissolve the non-polymerized material; and non-solvents are other compounds that cannot dissolve the non-polymerized material.

Mixtures of the solvents can also be used and may show synergistic effects when compared with a single solvent used alone. When a combination of two or more solvent is used, the resulting blend may be more effective as a solvent than the individual solvent alone.

Various co-solvents and non-solvents can also be employed with the solvent. Suitable co-solvents include, but are not limited to, terpene ester, alkyl ester, terpene ether, n-butanol, 2-ethoxyethanol, benzyl alcohol, ethanol, methanol, propanol, isopropanol, alpha terpineol, dipropylene glycol methyl ether, 2-butoxyethanol, isopropyl alcohol, and 2-(2-butoxyethoxy) ethanol, cyclopentanol, cyclohexanol, cycloheptanol, substituted cyclopentanol, substituted cyclohexanol, substituted cycloheptanol, cyclopentyl substituted alcohol, cyclohexyl substituted alcohol, and cycloheptyl substituted alcohol.

The co-solvent should be soluble in the solvent and the non-solvent, should have suitable dissolving properties towards the non-photolysed (non-polymerized) portions of the plate that are to be dissolved, should have low toxicity and acceptable safety profiles, and should be readily recyclable. The co-solvents are used to modify the properties of the solvent or solvent blend. This includes, for example, the addition of co-solvents to aid in the removal of the top protective cover skin on the flexographic plate. In addition, several of the co-solvents, such as terpene alcohols, in particular alpha terpineol, serve as stabilizers to prevent the separation of the solvent blend, which can occur at reduced temperatures. This stabilizer property of the co-solvent becomes important when isoparaffinic hydrocarbons are used as the non-solvent and benzyl alcohol is used as a co-solvent to remove the outer layer of the photopolymerizable printing plate because the benzyl alcohol may separate from the substituted benzenes and paraffinic hydrocarbon mixture. Further, the mixture of solvent and co-solvent may impart synergistic effect when used together.

The non-solvent should be miscible with the solvent and/or the co-solvent, should have acceptable toxicity and safety profiles, and should be readily disposable or recyclable. The non-solvents are typically used as a filler to reduce cost, therefore, recyclability of the non-solvent material is highly desirable. Suitable non-solvents include, but are not limited to, petroleum distillates, such as aliphatic petroleum distillates, naphthas, paraffinic solvents, hydrotreated petroleum distillates, mineral oil, mineral spirits, ligroin, decane, octane, hexane and other similar materials. Isoparaffinic solvents are commercially available in a wide range of volatility and corresponding flash points. The developing solvent of the invention can made with a wide range of commercially available isoparaffinic solvents as its non-solvent base.

Although certain presently preferred embodiments of the invention have been specifically described herein, it will be apparent to those skilled in the art to which the invention pertains that variations and modifications of the various embodiments shown and described herein may be made without departing from the spirit and scope of the invention. Accordingly, it is intended that the invention be limited only to the extent required by the appended claims and the applicable rules of law.

What is claimed is:

1. A method for purifying polymer-containing solvent used in developing printing plates, said method comprising the steps of centrifuging said solvent to separate the polymer from the solvent, wherein the solvent is selected from the group consisting of terpene esters, terpene ethers, alkyl esters, substituted benzenes, and combinations thereof.

2. The method of claim 1, wherein the steps comprises a continuous process.

3. The process of claim 1, wherein the process is a batch process.

4. The method of claim 1, wherein the polymer is selected from the group consisting of block co-polymers of styrene and butadiene, block co-polymers of styrene and isoprene, co-polymers of butadiene and acrylonitrile, terpolymers of butadiene, acrylonitrile, and acrylic acid.

5. The method of claim 1, wherein said solvent further comprises a co-solvent.

6. The method of claim 5, wherein the co-solvent is selected from the group consisting of n-butanol, 2-ethoxyethanol, benzyl alcohol, ethanol, methanol, propanol, isopropanol, alpha terpineol, dipropylene glycol methyl ether, 2-butoxyethanol, isopropyl alcohol, and 2-(2-butoxyethoxy) ethanol, cyclopentanol, cyclohexanol, cycloheptanol, substituted cyclopentanol, substituted cyclohexanol, substituted cycloheptanol, cyclopentyl substituted alcohol, cyclohexyl substituted alcohol, and cycloheptyl substituted alcohol.

7. The method of claim 6, wherein the substituted cyclohexanol is 4-ethycyclohexanol.

8. The method of claim 7, wherein the substituted cyclopentanol is 2,3 dimethylcyclopentanol.

9. The method of claim 7, wherein the cyclohexyl substituted alcohol is cyclohexyipropanol.

10. The method of claim 7, wherein the cyclopentyl substituted alcohol is 4-cyclopentylpentanol.

11. The method of claim 1, wherein said solvent further comprises a non-solvent.

12. The method of claim 11, wherein the non-solvent is selected from the group consisting of aliphatic petroleum distillates, naphthas, paraffinic solvents, hydro-treated petroleum distillates, mineral oil, mineral spirits, ligroin, decane, octane, and hexane.

13. The method of claim 12, wherein the paraffinic solvents are isoparaffins.

14. The method of claim 1, wherein the centrifuge is a bowl disc centrifuge with conical discs.

15. The method of claim 1, wherein the centrifuging step is performed at g forces of at least about 4000.

16. The method of claim 1, wherein the solvent is maintained at about 70° F.

17. The method of claim 1, further comprising the step of adding a precipitant or co-polymerizing material to the solvent.

18. The method of claim 1, further comprising the step of radiating the solvent with a wavelength of light appropriate to crosslink the polymer.

19. The method of claim 1, further comprising the step of filtering the solvent.

* * * * *